United States Patent [19]

Schulze et al.

[11] Patent Number: 5,284,780
[45] Date of Patent: Feb. 8, 1994

[54] METHOD FOR INCREASING THE ELECTRIC STRENGTH OF A MULTI-LAYER SEMICONDUCTOR COMPONENT

[75] Inventors: Hans-Joachim Schulze, Ottobrunn; Heinz Mitlehner, Munich, both of Fed. Rep. of Germany

[73] Assignee: Siemens Aktiengesellschaft, Munich, Fed. Rep. of Germany

[21] Appl. No.: 974,838

[22] Filed: Nov. 12, 1992

Related U.S. Application Data

[63] Continuation of Ser. No. 584,170, Sep. 18, 1990, abandoned.

[30] Foreign Application Priority Data

Sep. 28, 1989 [DE] Fed. Rep. of Germany ....... 3932489

[51] Int. Cl.⁵ ............................................. H01L 49/00
[52] U.S. Cl. ................................. 437/6; 437/24;
437/26; 437/959; 148/DIG. 128; 148/DIG. 23;
148/DIG. 161; 257/156; 257/171
[58] Field of Search ............... 437/6, 24, 26, 94, 911,
437/947, 959; 148/DIG. 128, DIG. 23, DIG.
161; 257/156, 171

[56] References Cited

U.S. PATENT DOCUMENTS

| | | | |
|---|---|---|---|
| 3,067,485 | 12/1962 | Ciccolella et al. | |
| 3,872,493 | 3/1975 | Roberts et al. | 437/6 |
| 3,943,547 | 3/1976 | Nagano et al. | 257/171 |
| 3,953,243 | 4/1976 | Goetzberger et al. | 437/11 |
| 4,056,408 | 11/1977 | Bartko et al. | 437/6 |
| 4,201,598 | 5/1980 | Tanaka et al. | 357/49 |
| 4,311,534 | 1/1982 | Bartko et al. | 257/156 |
| 4,467,343 | 8/1984 | Herberg | 257/171 |
| 4,792,530 | 12/1988 | Nilarp | 437/6 |
| 4,987,087 | 1/1991 | Voss | 437/24 |

FOREIGN PATENT DOCUMENTS

| | | | |
|---|---|---|---|
| 1097824 | 3/1981 | Canada | 437/6 |
| 0032386 | 7/1981 | European Pat. Off. | 437/6 |
| 0343797 | 11/1989 | European Pat. Off. | 257/171 |

OTHER PUBLICATIONS

Mueller; Grundlagen der Halbleiter-Elektronik, Springer-Verlag, Berlin-Heidelberg-New York, 1971, pp. 93-95.

Gerlach W., "Thyristoren", Springer-Verlag, 1979, pp. 151-159, specifically pp. 155-157.

*Primary Examiner*—Brian E. Hearn
*Assistant Examiner*—Trung Dang

[57] ABSTRACT

For increasing the electric strength of a semiconductor component that comprises a sequence of semiconductor layers of alternating conductivity type and which is adapted to be charged with a voltage that biases at least one of the p-n junctions that separate the layers from one another in the non-conducting direction, the carrier life is reduced only in the lateral region of the edge termination of this p-n junction. The carrier life is reduced by irradiation with electrons or protons or by introducing atoms having recombination properties.

5 Claims, 1 Drawing Sheet

2

METHOD FOR INCREASING THE ELECTRIC STRENGTH OF A MULTI-LAYER SEMICONDUCTOR COMPONENT

This is a continuation of application Ser. No. 584,170, filed Sep. 18, 1990, now abandoned.

BACKGROUND OF THE INVENTION

1. Field of the Invention

The present invention is directed to a method for increasing the electric strength of a multi-layer semiconductor component.

2. Description of the Related Art

Some methods for increasing the electric strength of a semiconductor component are described in the book by W. Gerlach, Thyristoren, which appeared as Vol. 12 in the series "Halbleiter-Elektronik", edited by W. Heywang and R. Mueller, Springer-Verlag, Berlin 1979, Pages 151–159. In particular, FIGS. 4.22 and 4.23 show wafer-shaped thyristors whose edges are respectively positively or negatively beveled in the regions of the p-n junctions, the p-n junctions being biased in the nonconducting direction. Pages 158 and 159 of this publication recite a method wherein the p-n junction biased in the non-conducting direction is executed as a planar structure. One or more concentric field limiting rings are provided which act like a voltage divider at the surface of the thyristor and reduce the surface field strength to such an extent that a surface puncture is avoided even under extremely high blocking voltage biases of the p-n junction.

SUMMARY OF THE INVENTION

It is an object of the invention to specify a method of making a semiconductor component having a noticeable enhancement of the electric strength.

The method of the invention is employed with respect to a semiconductor component that comprises a sequence of semiconductor layers of alternating conductivity type. The component is adapted to receive a voltage that biases at least one of the p-n junctions that separate the layers from one another in the non-conducting direction. Carrier life is reduced only in the edge termination region of this p-n junction by irradiation with electrons or protons or by introducing atoms having recombination properties.

The method of the invention is particularly distinguished in that it enables a quantitatively adjustable increase in the electric strength in a simple way. This quantitative adjustment occurs by selecting an appropriate irradiation energy and dose or by selecting the appropriate diffusion time and temperature. In particular, the method can be applied to semiconductor components whose electric strength has already been enhanced according to known methods so that a further enhancement thereof is achieved.

BRIEF DESCRIPTION OF THE DRAWINGS

Other objects, features, and advantages of the invention will best be understood from the following detailed description, taken in conjunction with the accompanying drawings, on which.

DESCRIPTION OF THE PRESENTLY PREFERRED EMBODIMENTS

Figure 1:
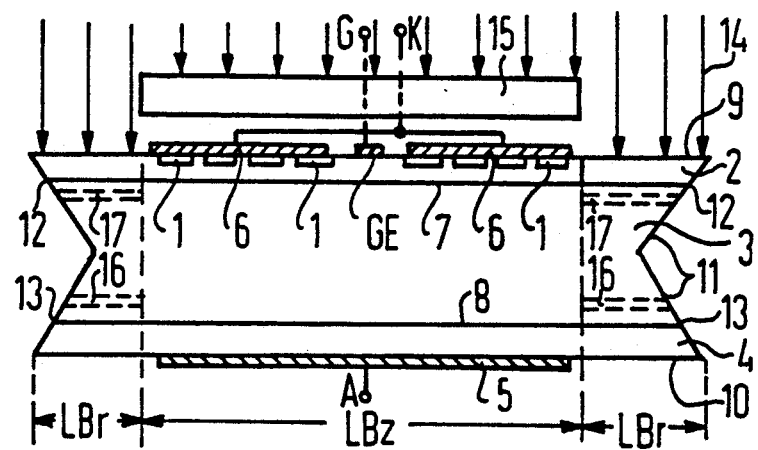
FIG. 1 shows the application of a first embodiment of the method of the invention to a thyristor.

FIG. 1 shows a thyristor having a semiconductor body composed of doped semiconductor material, for example, silicon. The thyristor comprises four successive layers of alternating conductivity types. Of these, the layer composed of the n-conductive sub-layer 1 is referred to as the n-emitter, the p-conductive layer 2 is referred to as the p-base, the n-conductive layer 3 is referred to as the n-base and the p-conductive layer 4 is referred to as the p-emitter.

The thyristor is provided with several terminals. The p-emitter 4 is provided with an anode-side electrode 5 composed of an electrically conductive material, for example aluminum. The electrode is provided with a terminal lead A. The n-emitter 1 is provided with a cathode-side electrode 6 that contacts the sub-layer 1. The electrode 6 is provided with a terminal lead K. In the illustrated exemplary embodiment, the cathode-side electrode 6 also contacts the layer 2 in order to form emitter shorts. A terminal lead G of a gate electrode GE provides contact with the p-base and is charged with a positive ignition current pulse in order to trigger the thyristor in the known manner.

When a voltage is applied to terminals A and K that places the electrode 5 to a more positive potential than the electrode 6, the p-n junction 7 between the layers 2 and 3 is biased in the nonconducting direction. When, on the other hand, a voltage is applied to terminals A and K that places electrode 5 at a more negative potential than the electrode 6, the p-n junction 8 between the layers 3 and 4 is biased in the non-conducting direction.

In order to guarantee a high electric strength of the thyristor, care must be exercised to see that a surface-side puncture of the p-n junctions 7 and 8 does not occur until high blocking voltages are applied. As shown, for example, in FIG. 1, the thyristor edge is respectively beveled with a positive angle proceeding both from the upper principal face 9 as well as from the lower principal face 10 for this purpose. A lowering of the surface field strength in the region of the lateral edge terminations 12 and 13 of the p-n junctions 7 and 8 lying in the lateral limiting face 11 is thus achieved. This reduces the risk of a puncture at this location.

In a first embodiment of the method of the invention, the carrier life is reduced by an irradiation with electrons only in the lateral region LBr of the lateral edge terminations 12 and 13. The irradiation is indicated in FIG. 1 with vertical arrows 14. The region LBz (i.e. the central region of the semiconductor component) is covered with an irradiation mask 15 of, for example, metal. The irradiation of the lateral region LBr results in the reduction of the carrier life from, for example, 200 μs to 10 μs only within the lateral region LBr. The short-circuit forward current transfer ratio $a_{pnp}$ is thus also lowered within LBr thus resulting in an increased electric strength in this region.

Proton irradiation can be used instead of an electron irradiation. When such irradiation is applied to a component having a vertical layer sequence, a thin zone 16 of reduced carrier life results dependent upon the selection of a defined irradiation energy, for example, 10 MeV. The zone 16 proceeds roughly parallel to the principal face 9 at a distance therefrom that is dependent on the irradiation energy. When the zone 16 of FIG. 1 is placed into the zone of the n-base that is neutral when the full sweep voltage is applied (i.e. when the zone 16 is placed outside of the space-charge zone that builds up as a consequence of the blocking bias at the p-n junction 7), a pronounced increase in the electric strength is achieved in the blocking direction.

In order to improve the electric strength in the non-conducting direction, it is recommendable to reduce the carrier life in a zone 17 by proton irradiation. The zone 17 should preferably lie in the portion of the n-base 3 that is neutral when the blocking voltage is applied (i.e., the zone 17 should lie outside of the space-charge zone that builds up as a consequence of the blocking voltage at p-n junction 8).

There is an advantage that is achieved in reducing the carrier life by proton irradiation when it is restricted essentially to the discrete zones referenced 16 or, respectively, 17 as compared to the uniformly reduced carrier life within LBr that results from the electron irradiation. This advantage lies in the more effective lowering of the current amplification factor $\alpha_{pnp}$ a result of the improved relationship between the recombination rate produced by the irradiation and the generation rate of free charge carriers given an existing space-charge zone.

The irradiation with electrons or protons can be directed from the cathode side as well as from the anode side and, in particular, can also be directed from both sides. Irradiation from both sides can be expedient under certain circumstances when both zones 16 and 17 are to be provided.

Figure 2:
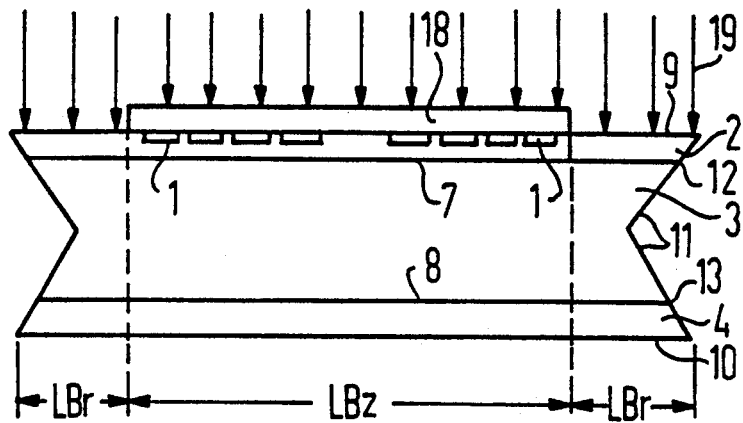
FIG. 2 shows the application of a second embodiment of the method of the invention to a thyristor.

FIG. 2 shows a thyristor having the layers 1–4 of FIG. 1 whose principal faces 9 and 10 have not yet been provided with electrodes and metallization. A second embodiment of the method of the invention is employed here in the lateral region LBr of the lateral edge terminations 12 and 13 for reducing the carrier life and increasing the electric strength. In this second embodiment of the method of the invention, the region LBz is first covered with a mask 18 of, for example, lacquer, oxide or metal. When such a lacquer mask is employed, it may be advantageously structured from a lacquer layer that initially completely covers the principal face 9 using inherently known photolithographic steps.

A masked diffusion step follows the application of the lacquer. The masked diffusion is comprised of an occupation step that, for example, is composed of a masked implantation (indicated by the arrows 19) of atoms of the said type into that part of the p-base 2 lying immediately under the principal face 9 and outside the mask 18. The masked diffusion step is further comprised of a drive-in step following the masked implantation wherein the atoms introduced into the p-base are driven farther into the semiconductor body. This drive-in step, for example, is implemented by heating the thyristor to approximately 800° C. over a time span of approximately two hours.

Instead of using a masked implantation, the occupation step can also be composed of a masked metal deposition of atoms having recombination properties. The masked metal deposition may be achieved by vapor-deposition or sputtering through a metal mask 18 or by means of a surface-wide metal deposition of the atoms having recombination properties. This is followed by a photolithographic etching to remove that part of the deposited metal layer that devolves onto LBz. The aforementioned drive-in step also follows the occupation step in these modifications of the second embodiment of the method of the invention.

A third embodiment of the method of the invention for reducing the carrier life within LBr includes an implantation process wherein atoms, specifically selected from the group consisting of Au and ft, having recombination properties are introduced into the layers 2–4 outside LBz. These atoms are introduced with an ion implantation step having an appropriately selected acceleration voltage. In this embodiment the ion implantation step takes place without an additional drive-in step. A curing step follows the implantation. Such an implantation method is also indicated by the arrows 19 in FIG. 2. After the mask 18 is removed, the electrodes and further occupations required according to FIG. are then applied onto the principal faces 9 and 10.

Figure 3:
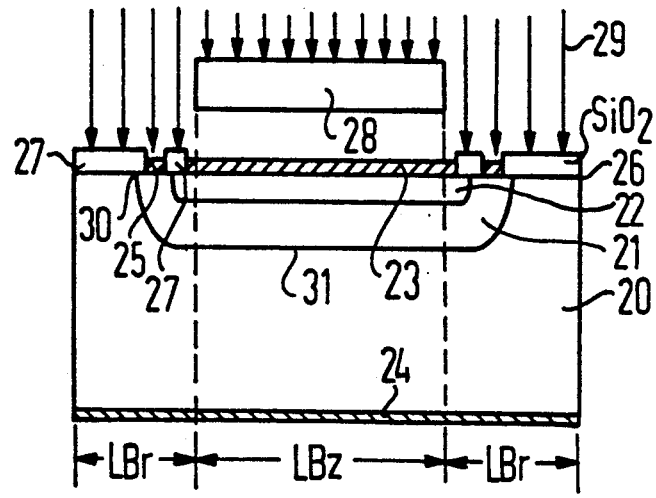
FIG. 3 shows the application of the first embodiment of the method of the invention to a planar transistor.

FIG. 3 shows the application of the first embodiment of the method of the invention to a planar transistor. The transistor is composed, for example, of an n-conductive layer 20, a p-conductive layer 21 embedded therein and an n-conductive layer 22 introduced therein. These layers respectively represent the collector, the base and the emitter. The emitter is provided with an emitter electrode 23, the collector is provided with a collector electrode 24 and the base is provided with a base electrode 25. The terminals associated with these electrodes are not shown for the sake of simplicity.

A first principal face 26 is provided with a passivation layer 27 of, for example, $SiO_2$ between the electrodes 23 and 25. After the application of an irradiation mask 28 that covers the central region LBz of the transistor, an irradiation with electrons indicated by the arrows 29 takes place. The irradiation effects a reduction in the carrier life in the region LBr of the edge termination 30 of the p-n junction 31 between the collector 20 and the base 21. This results in a noticeable increase in the electric strength of the transistor with respect to a voltage applied at electrodes 23 and 24 which places the collector electrode 24 at a more positive potential than the emitter electrode 23 and biases the p-n junction 31 in the non-conducting direction.

In a development of the first embodiment of the method of the invention, the semiconductor component irradiated with electrons or protons is subsequently tempered at a temperature of approximately 220° C. over a time span of, for example, 10 hours. This added tempering step results in greater stability of the electrical parameters of the semiconductor component at lower operating temperatures.

Although modifications and changes may be suggested by those skilled in the art, it is the intention of the inventors to embody within the patent warranted hereon all such changes and modifications as reasonably and properly come within the scope of their contribution to the art.

We claim as our invention:

1. A method for increasing electric strength of a thyristor formed of four successive layers of alternating conductivity types, specifically a first conductivity type emitter layer, a second conductivity type base layer, a first conductivity type base layer, and a second conductivity type emitter layer, the first conductivity type emitter layer having a cathode connection and the second conductivity type emitter layer having an anode connection, a first pn junction being formed between said first conductivity type base layer and second conductivity type base layer, and a second pn junction being formed between said first conductivity type base layer and second conductivity type emitter layer, comprising the steps of:

provideng an irradiation mask opposite a central active region of the thyristor at at least one end of said thyristor at said cathode or at said anode; and with a proton irradiation, providing a relatively narrow zone compared to a thickness of said first conductivity type base layer in said first conductivity type base layer at lateral regions thereof outside said mask and spaced from and between said second pn junction and said first pn junction, said relatively thin zone having reduced carrier life compared to a remainder of said first conductivity type base layer, and irradiation energy for said proton irradiation being selected so that said thin zone of reduced carrier life is in a region outside of a space-charge zone which builds up as a consequence of a blocking bias at the first pn junction.

2. A method for increasing electric strength of a thyristor formed of four successive layers of alternating conductivity types, specifically a first conductivity type emitter layer, a second conductivity type base layer, a first conductivity type base layer, and a second conductivity type emitter layer, the first conductivity type emitter layer having a cathode connection and the second conductivity type emitter layer having an anode connection, a first pn junction being formed between said first conductivity type base layer and second conductivity type base layer and a second pn junction being formed between said first conductivity type base layer and second conductivity type emitter layer, comprising the steps of:

providing an irradiation mask opposite a central active region of the thyristor at at least one end of said thyristor at said cathode or at said anode; and with a proton irradiation, providing a relatively narrow zone compared to a thickness of said first conductivity type base layer in said first conductivity type base layer at lateral regions thereof outside said mask and spaced from and between said first pn junction and said second pn junction, said relatively thin zone having reduced carrier life compared to a remainder of said first conductivity type base layer, and irradiation energy for said proton irradiation being selected so that said thin zone of reduced carrier life is in a region outside of a space-charge zone which builds up as a consequence of a blocking bias at the second pn junction.

3. A method for increasing electric strength of a thyristor, said thyristor being formed of a sequence of four successive layers of alternating conductivity types, specifically a first conductivity type emitter layer, a second conductivity type base layer, a first conductivity type base layer, and a second conductivity type emitter layer, said first conductivity type emitter layer being connected to a cathode and said second conductivity type emitter layer being connected to an anode, comprising the steps of:

providing a mask over a central active region of the thyristor adjacent one of said cathode or anode; and implanting atoms having recombination properties into lateral regions outside said central active region by ion implantation into said second conductivity type base layer, first conductivity type base layer, and second conductivity type emitter layer.

4. A method according to claim 3 wherein the atoms having recombination properties are defined by implanting atoms selected from the group consisting of Au and Pt atoms.

5. A method according to claim 3 wherein no heating drive-in is required following implanting of the atoms, and wherein a curing follows the implanting.

* * * * *